United States Patent
Sohda et al.

(10) Patent No.: US 6,511,048 B1
(45) Date of Patent: Jan. 28, 2003

(54) ELECTRON BEAM LITHOGRAPHY APPARATUS AND PATTERN FORMING METHOD

(75) Inventors: Yasunari Sohda, Hachioji (JP); Yasuhiro Someda, Kokubunji (JP); Hiroya Ohta, Kodaira (JP); Takashi Matsuzaka, Hitachinaka (JP); Norio Saitou, Tokorozawa (JP); Yoshinori Nakayama, Sayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/191,383

(22) Filed: Nov. 13, 1998

(51) Int. Cl.[7] .................................................. H01J 37/30
(52) U.S. Cl. ................. 256/492.2; 250/492.23
(58) Field of Search ...................... 250/492.2, 492.23, 250/492.22

(56) References Cited

U.S. PATENT DOCUMENTS

| | | | | |
|---|---|---|---|---|
| 3,573,528 A | * | 4/1971 | Maeda ......................... | 313/85 |
| 3,652,895 A | * | 3/1972 | Tsuneta ..................... | 313/85 S |
| 3,857,041 A | * | 12/1974 | Spicer ........................ | 250/492 |
| 4,393,312 A | * | 7/1983 | Collier ...................... | 250/492.2 |
| 5,153,441 A | * | 10/1992 | Moriizumi .............. | 250/492.2 |
| 5,256,881 A | * | 10/1993 | Yamazaki et al. ..... | 250/492.23 |
| 5,283,440 A | * | 2/1994 | Sohda et al. ............. | 250/492.2 |
| 5,334,845 A | | 8/1994 | Wakabayashi et al. | |
| 5,468,969 A | * | 11/1995 | Itoh et al. ............... | 250/492.23 |
| 5,774,222 A | * | 6/1998 | Maeda ........................ | 356/394 |
| 5,968,686 A | * | 10/1999 | Yamada et al. ............. | 430/296 |
| 6,004,699 A | * | 12/1999 | Yasuzato ....................... | 430/5 |

FOREIGN PATENT DOCUMENTS

| | | |
|---|---|---|
| JP | 6-120126 | 4/1994 |
| JP | 6-267834 | 9/1994 |
| JP | 97-134701 | 5/1997 |
| WO | WO90/11614 | 10/1990 |

OTHER PUBLICATIONS

K. Sakamoto et al, "Electron–Beam Block Exposure System for a 256 M Dynamic Random Access Memory", Journal of Vacuum Science and Technology, vol. B11, No. 6, Nov./Dec. 1993, pp. 2357–2361.

* cited by examiner

Primary Examiner—John R. Lee
Assistant Examiner—Anthony Quash
(74) Attorney, Agent, or Firm—Mattingly, Stanger & Malur, P.C.

(57) ABSTRACT

An electron beam lithography apparatus and a semiconductor device pattern forming method for precisely writing patterns near the periphery of a cell mask so that large scale integrated circuits and fine structure devices are fabricated at high yield rates. Cell figures with lower aperture rates are located peripherally and cell figures with higher aperture rates are located closer to a central portion within each of aperture groups furnished on a second mask of the inventive apparatus adopting cell projection. Illustratively, on a mask for use in semiconductor device fabrication, cell figures for forming line patterns and gate patterns are located centrally and cell figures for forming hole patterns are positioned peripherally in each aperture group. This allows the peripherally located figures to be written precisely in each aperture group.

15 Claims, 9 Drawing Sheets

ELECTRON BEAM LITHOGRAPHY APPARATUS AND PATTERN FORMING METHOD

BACKGROUND OF THE INVENTION

The present invention relates to an electron beam lithography apparatus and a semiconductor device pattern forming method for use therewith, the apparatus and method being arranged to write precisely patterns near the periphery of a cell mask so that large scale integrated circuits and fine structure devices may be fabricated at high yield rates.

Patterns of a semiconductor device are typically formed by an electron beam lithography apparatus as follows: digital data are first converted to a voltage or current signal by a DA converter. The converted voltage or current signal is amplified and fed as a deflection signal to an electrostatic deflector or a magnetic deflector whereby an electron beam is deflected. The deflected electron beam is controlled for exposure position on a target such as a semiconductor device. The target is then exposed to the beam.

For writing on the target with an electron beam, the so-called cell projection method has been used extensively to boost the throughput of fine electron beam lithography. The method has some disadvantages as discussed in "Journal of Vacuum Science and Technology; Vol. B11, No. 6, 1993" (pp. 2357–2361). That is, a significantly high degree of deflection on the mask causes substantial aberration in a crossover image. The aberration can provoke problems such as current density fluctuations in the electron beam on the target. The publication cited above describes ways to bypass the bottleneck through correction of the aberration.

Figure 3:
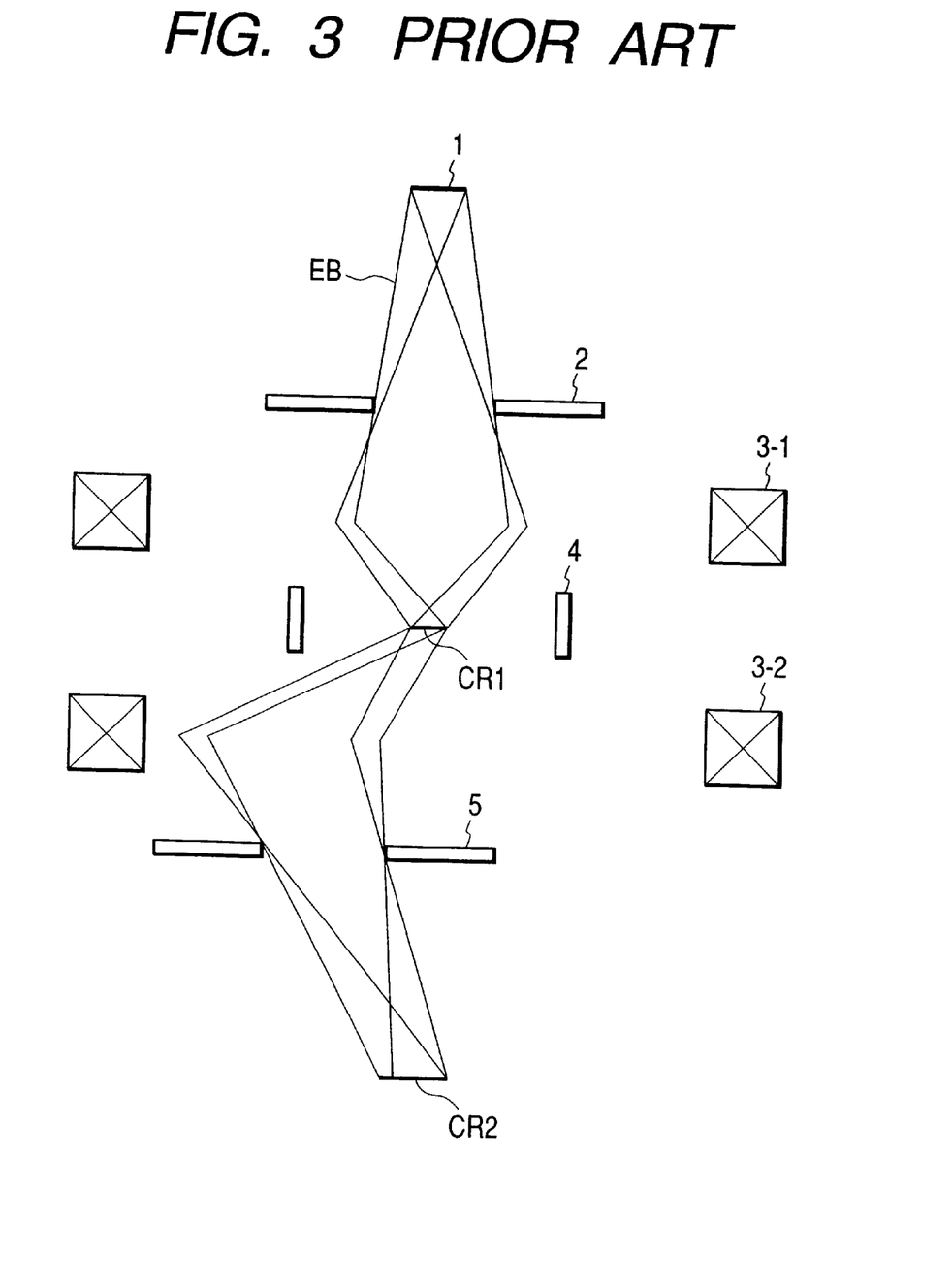
FIG. 3 is a schematic view illustrating how aberration of a crossover image occurs conventionally.
Figure 4A:
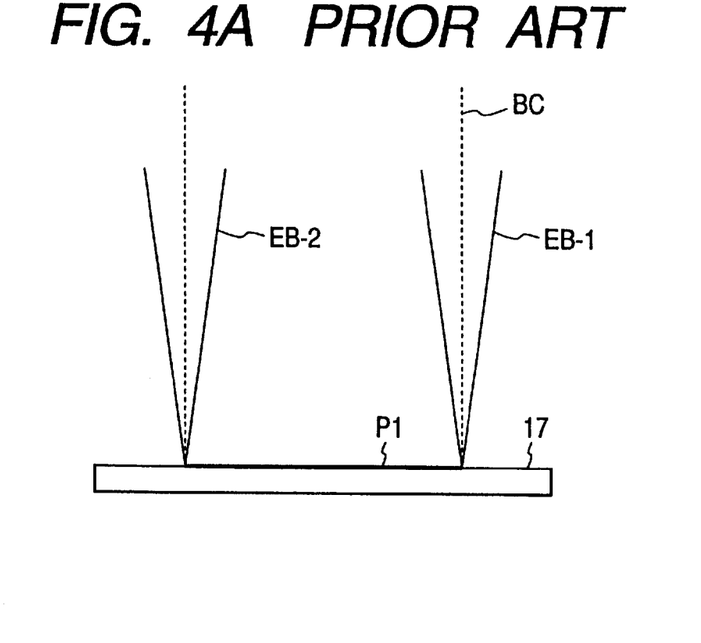
FIGS. 4A and 4B are schematic views showing effects of the conventionally experienced aberration of the crossover image.
Figure 4B:
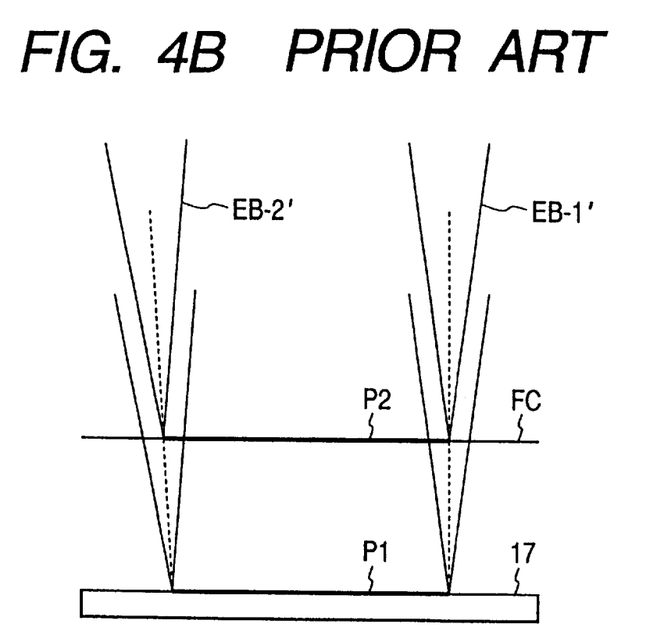
Figure 5:
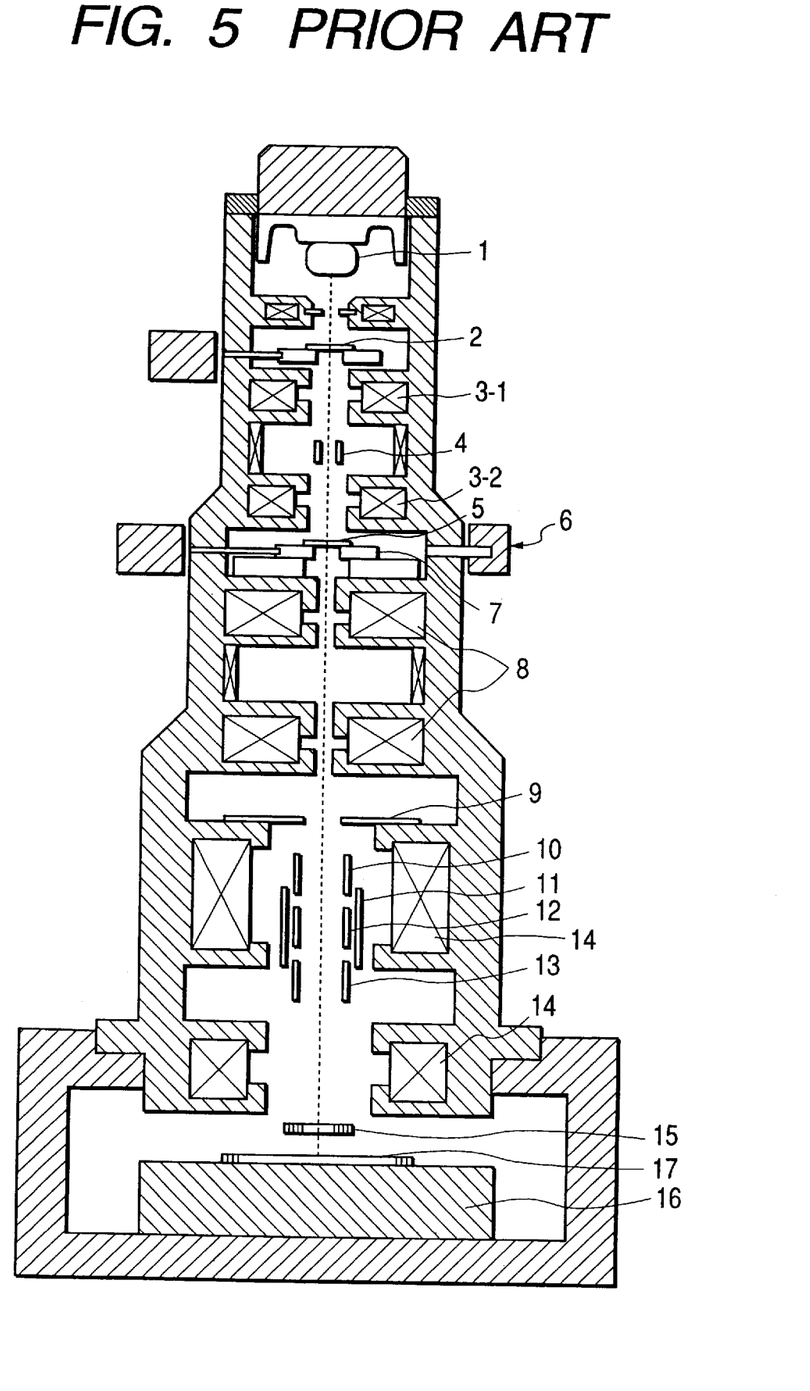
FIG. 5 is a schematic view depicting a typical constitution of a conventional electron beam lithography apparatus.

FIG. 3 is a schematic view of electron trajectories in a projection lens unit of a conventional electron beam lithography apparatus, illustrating how the aberration of a crossover image occurs. FIGS. 4A and 4B are schematic views of electron beams entering targets, showing effects of the aberration of a crossover image. FIG. 5 is a schematic view depicting a typical constitution of a conventional electron beam lithography apparatus operating on the cell projection method.

In FIG. 5, an electron beam from an electron gun 1 is projected directly onto a first mask 2. An image of the first mask 2 is formed on a second mask 5 by two-stage projection lenses 3-1 and 3-2. Located between the two masks, a cell selection deflector 4 selects a desired aperture (i.e., pattern) from among a plurality of apertures on the second mask 5.

Referring to FIG. 3, trajectories of the electron beam EB inside the projection lens unit will now be described in detail. The electron beam EB from the electron gun 1 first passes through a rectangular aperture of the first mask 2 before being projected onto the second mask 5 by the first and second projection lenses 3-1 and 3-2. This forms an image of the rectangular aperture of the first mask 2 on the second mask 5. At this point, a first crossover image (i.e., rectangular aperture image of the first mask) CR1 formed by the first projection lens 3-1 is moved in deflective fashion by the cell selection deflector 4 onto the second mask 5. The image thus moved is arranged to coincide with an appropriate cell aperture for cell projection, whereby the pattern (aperture) to be written is selected. The electron beam EB thus passes off the axis of the second projection lens 3-2. This gives rise to a significant degree of aberration in a second crossover image CR2.

As shown in FIG. 5, the electron beam past the second mask 5 is contracted by a two-stage demagnification lens arrangement 8. The contracted electron beam passes through an objective lens 14 and is focused eventually on a sample 17. The aberration developed in the first and the second crossover image CR1 and CR2 causes the electron beam passing through both extremes of the pattern (aperture) to vary its transiting position within the lens. Because the electron beam position differs at a halfway objective aperture 9 within the pattern, irregularities in current density take place inside the pattern. In addition, not all electrons within the pattern can pass through the lens center, resulting in resolution non-conformity.

Other effects of the aberration will now be described with reference to FIGS. 4A and 4B. FIG. 4A shows beam paths in effect when there is no aberration in the crossover image, while FIG. 4B depicts beam paths in effect when the crossover image involves aberration. In the case of FIG. 4A, the electron beams EB-1 and EB-2 passing at both ends of the pattern enter the sample 17 at about the same angle. Because the electron beams EB-1 and EB-2 each enter the sample 17 at a beam center BC, there is no change in the size of a projected pattern P1. In the case of FIG. 4B, on the other hand, electron beams EB-1' and EB-2' passing at both extremes of the pattern enter the sample 17 at different incidence angles. (In FIG. 4B, the electron beam EB-2' enters the sample at a tilted incidence angle.) As a result, attempts at focus correction to reduce the Coulomb effect vary the size of a pattern P2 on a focus correction plane FC. (In FIG. 4B, the pattern P2 is seen enlarged.) These adverse effects can be reduced by correcting the aberration of the crossover image, but coma aberration and chromatic aberration are difficult to correct. Where focus correction is not carried out, focusing errors still occur in practice and can degrade pattern size accuracy.

Since aberration increases in proportion to the distance of the aperture (pattern) from the lens center (i.e. from the optical axis), the above-described effects become more pronounced the closer the aperture (pattern) in question is to the periphery of a group of apertures.

Field curvature and astigmatism may be corrected but not to a satisfactory degree. Coma aberration and chromatic aberration are difficult to correct, as described above. In sum, thorough correction cannot be expected from the conventional setup.

SUMMARY OF THE INVENTION

It is therefore an object of the present invention to overcome the above and other deficiencies and disadvantages of the prior art and to provide an electron beam lithography apparatus arranged to write precisely patterns close to the periphery of a cell mask through reduction of aberration-induced adverse effects.

It is another object of the present invention to provide a pattern forming method for fabricating large scale integrated circuits and fine structure devices at high yield rates.

In carrying out the invention and according to one aspect thereof, there is provided a pattern forming method whereby apertures within a single aperture group on a cell mask are located closer to the periphery of the group the lower the aperture rate is for each aperture (pattern). Where patterns are to be written for the fabrication of large scale integrated circuits, the same aperture group may include both line pattern apertures and hole pattern apertures. In such a case, the hole pattern apertures should be placed outside the line pattern apertures for effective fabrication.

The same improvement is expected where, within the same aperture group on the cell mask, apertures involving shorter pattern spacing (aperture spacing) are located closer to the periphery of the group than apertures having longer pattern spacing.

Like benefits are expected when, within the same aperture group on the cell mask, apertures involving shorter pattern lengths (aperture lengths) are arranged to be located closer to the periphery of the group than apertures having longer pattern lengths.

It is also effective, within the same aperture group on the cell mask, to establish outside a cell figure a second cell figure comprising part or all of the patterns constituting the cell figure inside.

It is preferred that apertures each having a single pattern (i.e., apertures having no periodicity) for use in writing peripheral circuits be arranged to be located closer to the periphery of the aperture group.

Further benefits are gained when the peripheral regions of an aperture group having large aberration are arranged to comprise not cells to be written but cells for optical adjustment.

The arrangements above combine to make focus correction for correcting the Coulomb effect more effective than before.

Writing accuracy is also enhanced effectively by adjusting exposure time in keeping with the aperture position in each aperture group. Increasing the deflection distance of the beam for cell selection tends to worsen the distortion of the first mask image. Since the cell projection method involves forming the second mask image on a sample, the distortion of the first mask image does not appear to be very important. However, a distorted first image triggers fluctuations in the beam current density. The result is that the closer the beam to the periphery of the second mask, the more unstable the beam current density on the sample. This requires that exposure time be adjusted suitably depending on the aperture position for higher writing accuracy.

These and other objects, features and advantages of the invention will become more apparent upon a reading of the following description and appended drawings.

DETAILED DESCRIPTION OF THE PREFERRED EMBODIMENTS

Figure 1:
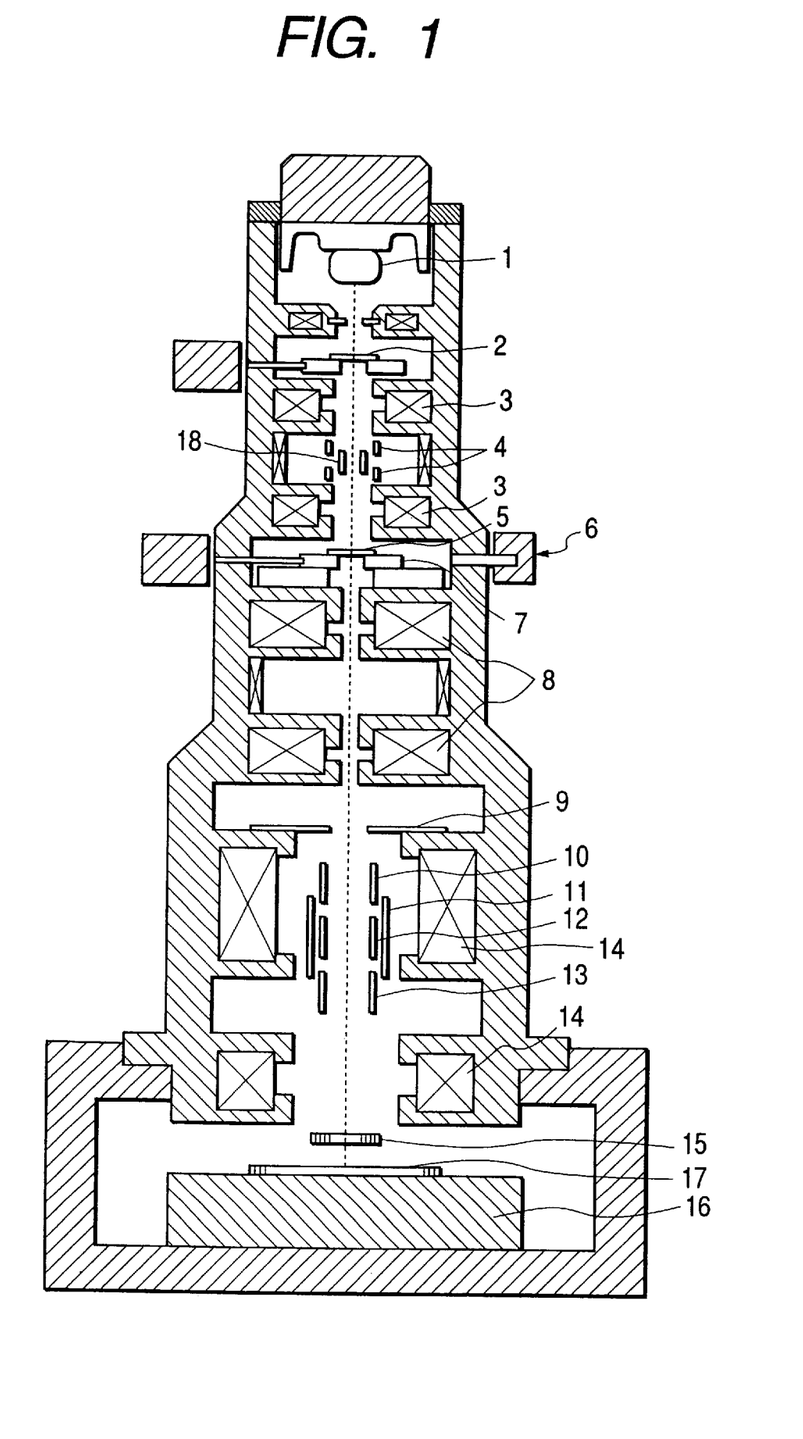
FIG. 1 is a schematic view of an electron beam lithography apparatus embodying the invention.

Preferred embodiments of this invention will now be described in detail with reference to the accompanying drawings. FIG. 1 is a schematic view of an electron beam lithography apparatus embodying the invention, the apparatus operating on a cell projection method.

Figure 2:
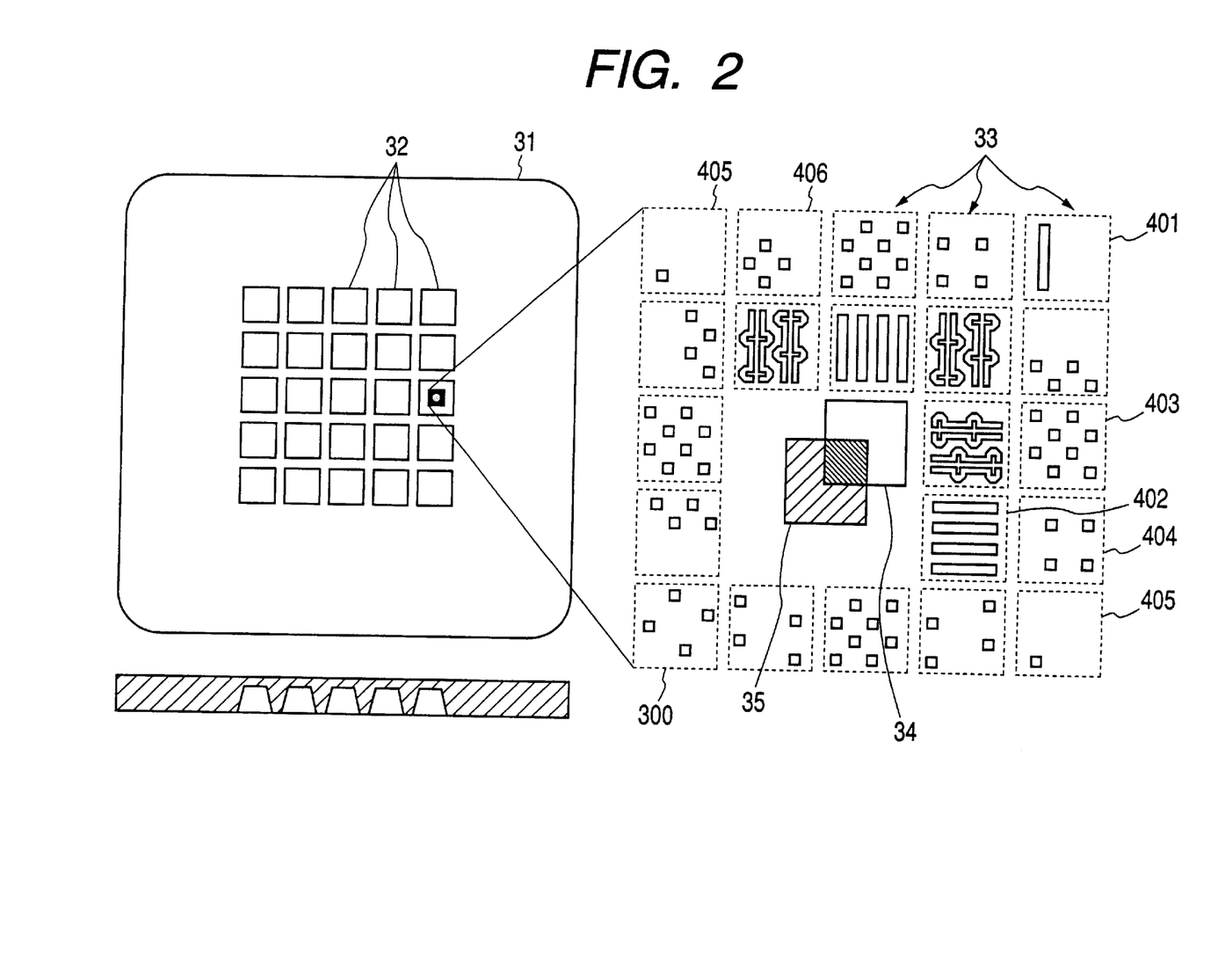
FIG. 2 is a schematic view showing a typical arrangement of apertures in a cell mask for use by the inventive electron beam lithography apparatus of FIG. 1.

The invention is characterized by its use of a cell mask whose patterns are arranged as shown in FIG. 2. The cell mask is used as a first mask 2 and a second mask 5 by the electron beam lithography apparatus shown in FIG. 1. The apparatus of FIG. 1 differs from its conventional counterpart of FIG. 5 in terms of the arrangement of patterns in the second mask 5. A variable shaping deflector 18 supplementing a cell selection deflector 4 in FIG. 1 is shown here only as an additional detail.

Rectangles indicated in broken lines on the right-hand side of FIG. 2 make up a single exposure area 33 for cell aperture, shown enlarged. Patterns indicated in solid lines on the left-hand side of FIG. 2 are actual aperture patterns. With this embodiment, each of a plurality of aperture groups 32 in a silicon mask 31 of FIG. 2 comprises a plurality of exposure areas 33 for cell aperture shown on the right. At the center of each aperture group 32 is a rectangular aperture 34 for variable shaping. At the time of writing in variable shaping mode, a first mask image 35 is adjusted for a suitable overlay on the rectangular aperture 34 to form a variable shaping beam.

As shown in FIG. 2, if apertures (patterns) with lower aperture rates are located closer to the periphery within each aperture group, the distance of focus correction is reduced. This in turn minimizes adverse effects of the aberration caused by large angle deflection for cell selection.

Six typical aperture arrangements are described below:

(a) Where line pattern apertures 402 and hole pattern apertures 403 used frequently for integrated circuit fabrication are included in the same aperture group 32, the hole pattern apertures 403 are located outside the line pattern apertures 402. The hole pattern apertures 403 generally have lower aperture rates than the line pattern apertures 402 and have no shot connections. As such, the hole pattern apertures 403 are much less vulnerable to the aberration-caused effects as well as to pattern shape fluctuations.

(b) The same benefit is obtained when, within the same aperture group, apertures 406 having shorter pattern spacing (aperture spacing) are located outside those with longer pattern spacing. The reason is that apertures with shorter pattern spacing are less vulnerable to irregularities between patterns (apertures). Likewise, in the same aperture group, apertures (e.g., 403) having shorter lengths (aperture lengths) may be located advantageously outside those with greater lengths. The benefit is attributable to the fact that apertures with reduced pattern lengths (aperture lengths) are less vulnerable to irregularities within each pattern (aperture) because of their reduced intra-aperture areas.

(c) The aperture rate may otherwise be lowered by locating outside a first cell figure a second cell figure comprising part (or all) of the patterns constituting the first cell figure inside. The second cell figure may be used as an effective means for proximity effect correction in writing peripheral parts of circuits. Illustratively, an aperture 404 corresponding to the second cell figure in FIG. 2 comprises some of the patterns (apertures) making up the aperture 403 representing the first cell figure.

(d) Another way of lowering the aperture rate and minimizing pattern expansion is to locate, peripherally within each aperture group, cell figures (e.g., 401 and 405) each made of a single fine figure for a peripheral circuit. Illustratively, the aperture 401 is constituted by one fine figure by which to write a peripheral circuit, and the aperture 405 is composed of one of a plurality of figure patterns constituting the aperture 404.

(e) In a pattern arrangement of high aperture rates in which the whole exposure area for cell aperture includes numerous apertures, it is preferred that these apertures be located as spare patterns not centrally but peripherally within each aperture group. Using the peripherally located spare patterns for writing reduces writing accuracy in the short term. Still, these patterns are adequate as substitutes until a new mask is made available as their replacement.

(f) In the peripheral region of each aperture group where aberration is pronounced, apertures 300 are provided not for pattern delineation but for optical adjustment. For example, the use of marking apertures for optical adjustment may develop deviations of aberration correction but does not directly affect writing accuracy. This makes it possible, with a limited number of patterns, to deploy effectively patterns to be written.

First Embodiment

Figure 6:
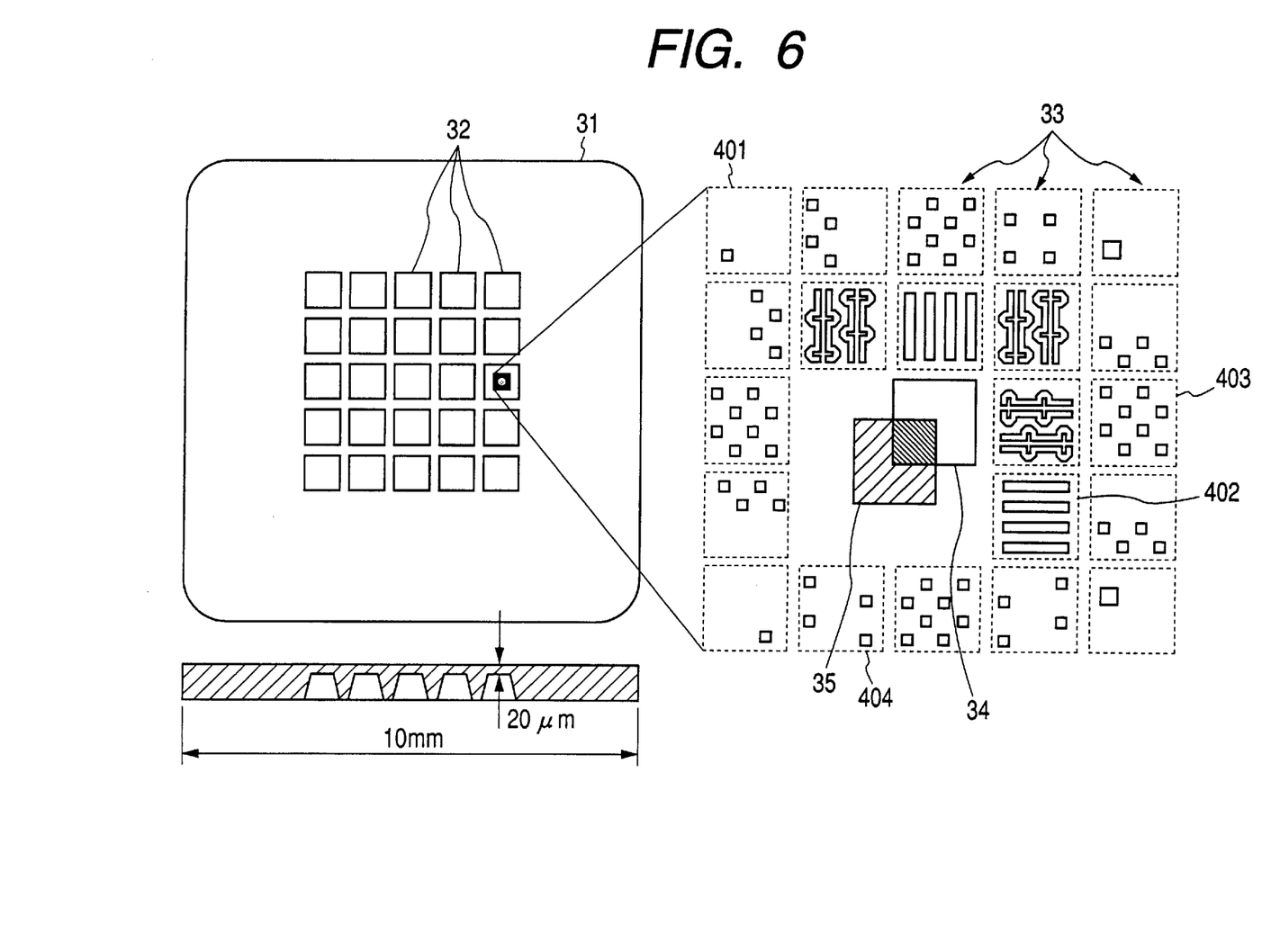
FIG. 6 is a schematic view showing a typical arrangement of apertures in a cell mask as a first embodiment of the invention.

FIG. 6 shows a typical arrangement of a mask pattern used by the electron beam lithography apparatus of FIG. 1. The acceleration voltage of an electron beam in the apparatus of FIG. 1 is 50 kV. The second mask 5 (31 in FIG. 6) is a 10 mm-square silicon plate whose aperture-formed region is 20 $\mu$m thick. The surface of the mask 5 is coated with platinum (Pt), platinum-palladium (Pt—Pd) or platinum-iridium (Pt—Ir) by vapor deposition. The mask 5 is introduced through a mask switching chamber 6 into a vacuum chamber, and is set on a mask stage 7. The position of the stage 7 is adjusted so that the center of the aperture group to be selected is overlaid on the optical axis of the electron beam.

A rectangular aperture 34 for variable shaping is located in the middle of each of the aperture groups 32. Five apertures 402 for forming line patterns and gate patterns are located closer to the center, and 12 apertures 403 for forming hole patterns are located peripherally. At the four corners of each aperture group 32 are apertures 401 and 405 each having a single pattern identical to one of those located closer to the center, as well as an aperture 300 comprising figures for optical adjustment. The maximum size of a pattern (aperture) is 125 $\mu$m square, and the demagnification ratio of a demagnification lens 8 is 1/25. Thus the maximum size of a figure projected onto a target (wafer) 17 is 5 $\mu$m square. The current density of the beam is 10 A/cm$^2$ on the wafer 17.

In FIGS. 1 and 5, reference numeral 10 stands for a focus corrector, 11 for a main deflector, 12 for a sub deflector, 13 for sub-sub deflector, 14 for an objective lens, 15 for a secondary electron detector, and 16 for a sample stage.

The mask 31 having aperture groups 32 with their pattern arrangement shown in FIG. 6 is used as the second mask 5 in the electron beam lithography apparatus of FIG. 1. In each aperture group 32, line patterns are formed by the cell projection method using centrally located patterns (apertures) and hole patterns are formed by the same method using peripherally located patterns (apertures). Peripheral circuits are also formed by the cell projection method using the patterns (apertures) located at the four corners of each aperture group 32.

In the first embodiment, focus correction is carried out simultaneously with the selection of a figure (aperture). The aperture rate is about 40% for the line patterns and 15% or less for the hole patterns. Thus the distance of focus correction is about 40 $\mu$m for the line patterns and 15 $\mu$m or less for the hole patterns. Where the apertures for forming the hole patterns are located peripherally in each aperture group, adverse effects cause by aberration in the crossover image are attenuated. Stitching accuracy is 0.04 $\mu$m for the line patterns and 0.05 $\mu$m for the hole patterns. In an experiment, the arrangements were reversed: the apertures for forming the line patterns were located peripherally while those for forming the hole patterns are positioned centrally in each aperture group. Following pattern formation, the stitching accuracy and overlay accuracy were 0.07 $\mu$m and 0.05 $\mu$m respectively. The experiment revealed that the resulting stitching accuracy was inferior to that of the first embodiment by as much as 0.03 $\mu$m.

With the first embodiment, exposure dosage is made higher the farther the pattern is from the center of each aperture group. For example, the patterns at the four corners of each aperture group get 3% more of exposure dosage than the inner patterns.

Second Embodiment

Figure 7:
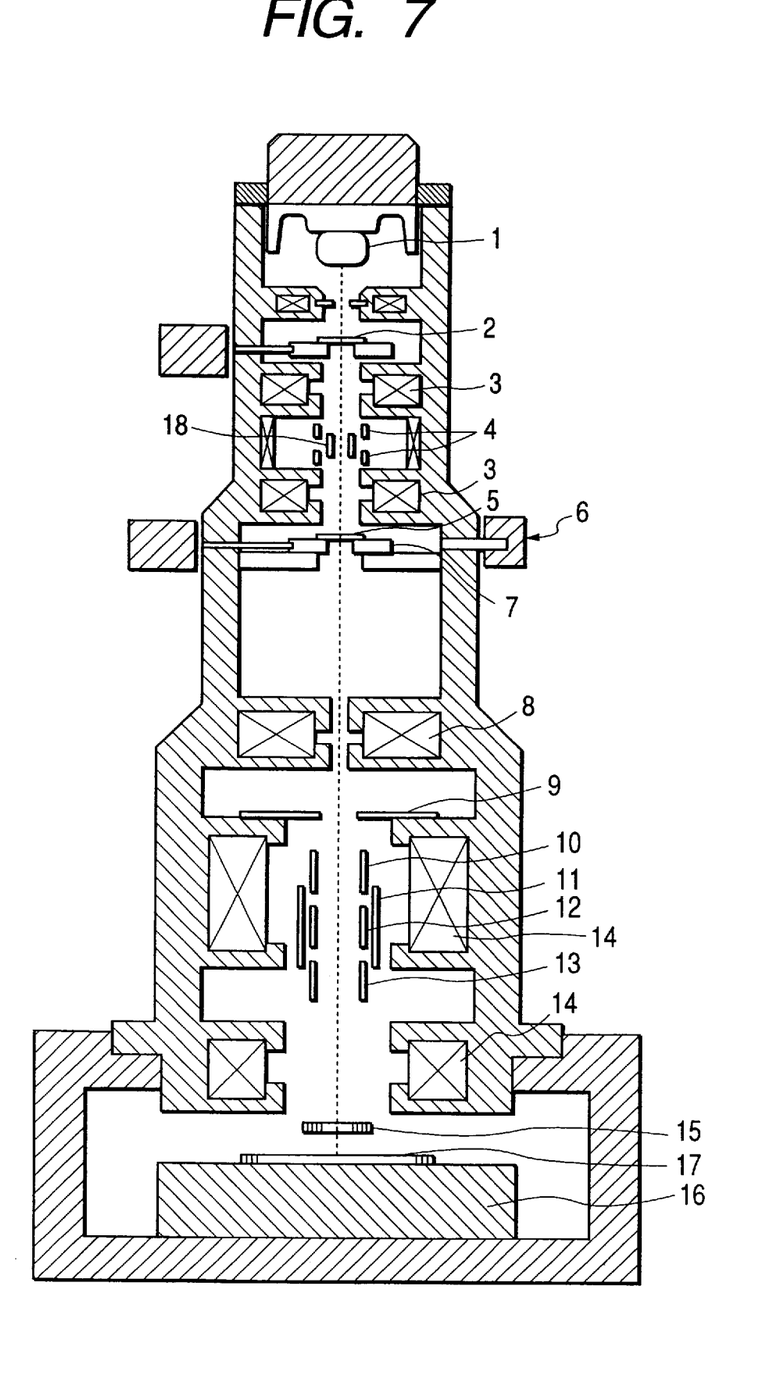
FIG. 7 is a schematic view of an electron beam lithography apparatus as a second embodiment of the invention.
Figure 8:
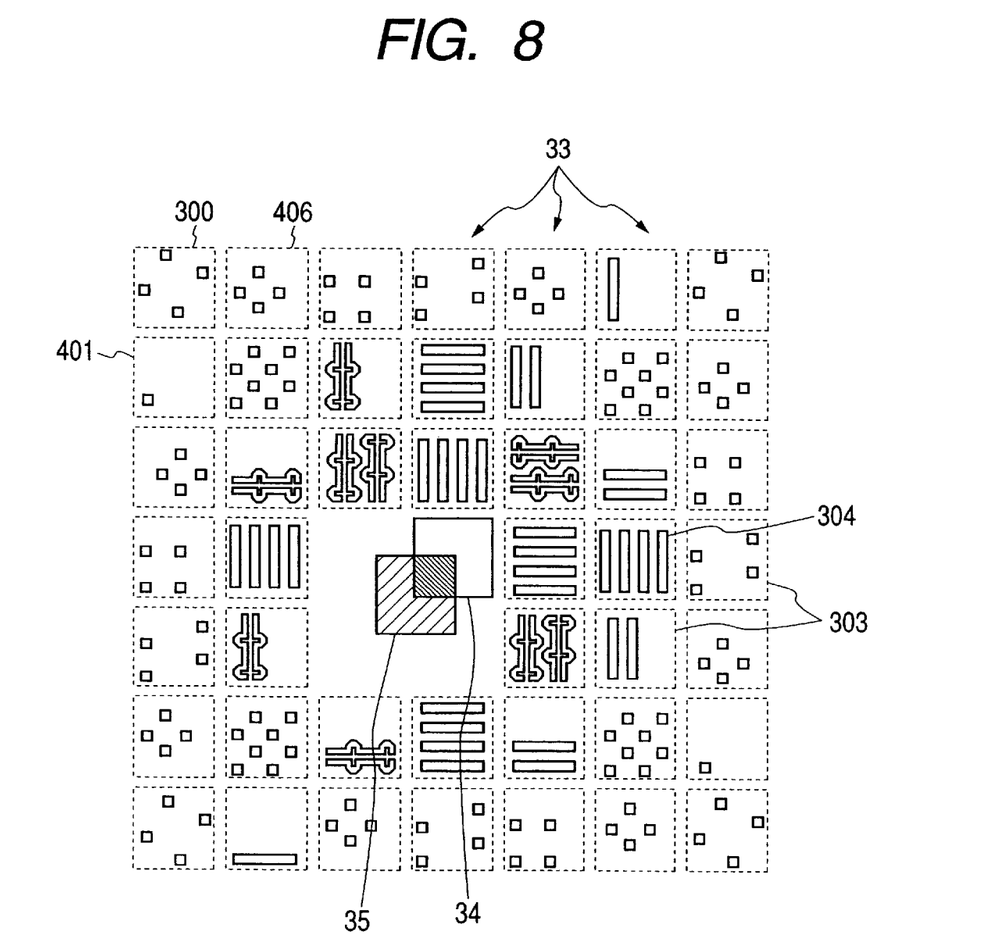
FIG. 8 is a schematic view illustrating a typical arrangement of apertures in a cell mask for use by the inventive electron beam lithography apparatus of FIG. 7.

FIG. 7 is a schematic view showing a typical constitution of an electron beam lithography apparatus as the second embodiment of the invention. FIG. 8 illustrates a typical arrangement of a mask pattern used by the inventive electron beam lithography apparatus of FIG. 7.

The second embodiment utilizes a single-stage demagnification lens arrangement 8. The acceleration voltage of the electron beam with the second embodiment is 50 kV, the same as with the first embodiment.

As shown in FIG. 8, a total of 45 aperture patterns are included in each of the aperture groups on the second mask 5 excluding the centrally located rectangular aperture 34. In addition to the rectangular aperture 34 for variable shaping located at the center of each aperture group, the apertures for forming line and gate patterns are generally located toward the center and the apertures for forming hole patterns are located peripherally. Pattern apertures 303 each comprising part of the apertures for forming line and hole patterns are located away from the center of each aperture group. Of the apertures above, those with shorter pattern spacing such as an aperture 406 and those with reduced pattern lengths such as an aperture 304 are located away from the center of each aperture group. At the four corners of each aperture group are the apertures 300 for optical adjustment. Some apertures 304 have the same aperture patterns as those closer to the center. On the mask 5, the maximum figure (aperture) size is 125 $\mu$m and the demagnification ratio of demagnification optics is 1/25. Thus the maximum pattern size on the wafer 17 is 5 $\mu$m and the beam current density is 10 A/cm$^2$ on the wafer 17.

The marking apertures 300 for optical adjustment at the four corners of each aperture group are first used to measure the aberration of a crossover image. The measured value is used as the basis for calculating the aberration of other apertures by interpolation. When the marking apertures 300 for optical adjustment are located as far away from the center as possible, the accuracy of aberration measurement in other apertures is improved. Because the marking apertures 300 for optical adjustment are not used for writing, the sensitivity of an aberration corrector may be reduced.

The inner figures are then used to form the line patterns and the outer figures are employed to form the hole patterns. The peripherally located figures with relatively few apertures are used to adjust exposure dosage near circuit peripheries for proximity effect correction in the smallest possible area. Because adverse effects of the aberration in the crossover image are smaller the larger the figure (aperture) becomes, the figures having apertures concentrated in reduced areas may be located advantageously near the periphery. In an experiment wherein a figure (aperture) for forming line patterns was used for about one month, that figure was soiled by impurities. Then the contaminated figure (aperture) was replaced by another Figure 304 (aperture) located immediately outside the contaminated figure.

Figure 9:
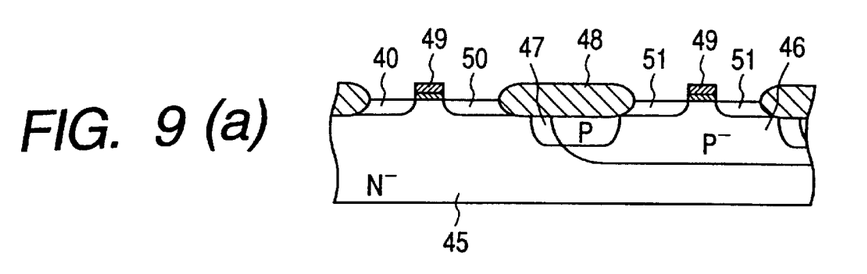
FIG. 9 is a process diagram depicting an inventive method for fabricating a semiconductor device.

In FIG. 9, (a) through (d) depict an inventive method for fabricating a semiconductor device. Initially, a P⁻ well layer 46, a P⁻ layer 47, a field oxide film 48, polysilicon/silicon oxide film gates 49, a P⁻ high density diffusion layer 50, and an N⁻ high density diffusion layer 51 are formed by known techniques on an N⁻ silicon substrate 45 (see (a) in FIG. 9).

An insulating film 52 made of phospho-silicate glass (PSG) is then deposited on the substrate. The insulating film 52 is coated with an electron resist 53. Hole patterns 54 are then formed by subjecting the electron resist 53 to inventive techniques involving a cell mask (see (b) in FIG. 9).

The electron resist 53 thus patterned is used as a mask through which the insulating film 52 is subjected to dry-etching. This step produces contact holes 55 (see (c) in FIG. 9).

W/TiN electrode lines 56 are then formed. The lines 45 are covered with an interlayer insulating film 57. The insulating film 57 is again coated with an electron resist. Hole patterns 58 are formed by subjecting the electron resist to inventive techniques involving the cell mask. W plugs are formed in buried fashion in the hole patterns 58. Thus furnished, the W plugs are connected to Al second lines 59 (see (d) in FIG. 9).

The passivation process subsequent to the above steps utilizes known, conventional techniques. Although the description above of the second embodiment dealt with major fabrication processes only, the related techniques are the same as those conventionally employed except for the use of the inventive steps in the lithography process described above.

The steps above when carried out fabricate CMOS LSIs at high yield rates. When semiconductor devices were fabricated by use of the pattern forming method described above, it was possible to prevent misalignment conventionally caused by pattern distortion, or that poor stitching of buried metal parts in holes which is conventionally attributed to irregularities in resolution and current density. The result was a significantly improved yield rate for products.

Although the embodiments above were shown dealing with the rectangularly arranged 21 cell figures (see FIG. 2) or 45 cell figures (see FIG. 8), this is not limitative of the invention. The invention also applies to cell figures arranged circularly or otherwise. In any case, it is evident that figures (apertures) with lower aperture rates or reduced aperture lengths such as those for forming hole patterns are advantageous when located as far away from the deflection center of a cell selection deflector as possible. The structure of projection lenses and the demagnification ratio of the electron optics are not limited to those of the above-described embodiments. The invention alternatively applies to any electron beam lithography apparatus wherein figures are selected depending on the deflection of the electron beam so that the selected figures (i.e., electron beam image) are contracted and projected onto a target. Other changes and variations of the invention may also be made without departing from the spirit or scope thereof.

As described, the electron beam lithography apparatus and pattern forming method according to the invention permit accurate writing of figures located peripherally in each of the aperture groups furnished on a cell mask. This makes it possible to fabricate large scale integrated circuits and fine structure devices at high yield rates.

What is claimed is:

1. A pattern forming method using a cell projection electron beam lithography system, comprising the steps of:

irradiating an electron beam emitted from an electron gun onto a first mask having a first rectangular aperture, for forming said electron beam into a rectangular cross-sectional electron beam;

irradiating said rectangular cross-sectional electron beam from said first mask onto a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and projecting said electron beams having said cell figures onto a target surface to be pattern-formed, through a cell projection system having a demagnification lens and an objective lens, for writing said cell figures on said target surface;

wherein said first cell aperture exposure areas are located on a peripheral portion of said second mask and said cell apertures contained in said first cell aperture exposure areas have a lower aperture area rate than that of said cell apertures contained in said second cell aperture exposure areas, and said second cell aperture exposure areas are located closer to the central portion of said second mask than said first cell aperture exposure areas.

2. A pattern forming method using a cell projection electron beam lithography system, comprising the steps of:

irradiating an electron beam emitted from an electron gun onto a first mask having a first rectangular aperture, for forming said electron beam into a rectangular cross-sectional electron beam;

irradiating said rectangular cross-sectional electron beam from said first mask onto a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and projecting said electron beams having said cell figures onto a target surface to be pattern-formed, through a cell projection system having a demagnification lens and an objective lens, for writing said cell figures on said target surface;

wherein said first cell aperture exposure areas are located on a peripheral portion of said second mask and said cell apertures contained in said first cell aperture exposure areas have a shorter aperture spacing than that of said cell apertures contained in said second cell aperture exposure areas, and said second cell aperture exposure areas are located closer to the central portion of said second mask than said first cell aperture exposure areas.

3. A pattern forming method using a cell projection electron beam lithography system, comprising the steps of:

irradiating an electron beam emitted from an electron gun onto a first mask having a first rectangular aperture, for forming said electron beam into a rectangular cross-sectional electron beam;

irradiating said rectangular cross-sectional electron beam from said first mask onto a second mask having a rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and projecting said electron beams having said cell figures onto a target surface to be pattern-formed, through a cell projection system having a demagnification lens and an objective lens, for writing said cell figures on said target surface;

wherein said first cell aperture exposure areas are located on a peripheral portion of said second mask and said cell apertures contained in said first cell aperture exposure areas have a shorter aperture length than that of said cell apertures contained in said second cell aperture exposure areas, and said second cell aperture exposure areas are located closer to the central portion of said second mask than said first cell aperture exposure areas.

4. A pattern forming method according to claim 1, wherein exposure dosage is adjusted depending on where said cell figures to be written are located within each of said cell aperture exposure areas.

5. A pattern forming method according to claim 2, wherein exposure dosage is adjusted depending on where said cell figures to be written are located within each of said cell aperture exposure areas.

6. A pattern forming method according to claim 3, wherein exposure dosage is adjusted depending on where said cell figures to be written are located within each of said cell aperture exposure areas.

7. An electron beam lithography apparatus using a cell projection electron beam lithography method, comprising:

an electron gun arranged to emit an electron beam;

a first mask having a first rectangular aperture for forming said electron beam emitted from said electron gun into a rectangular cross-sectional electron beam;

a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and a cell projection system having a demagnification lens and an objective lens, arranged to receive said electron beams from said second mask and to write said cell figures on a target surface to be pattern-formed;

wherein said first cell aperture exposure areas are located on a peripheral portion of said second mask and said cell apertures contained in said first cell aperture exposure areas have a lower aperture area rate than that of said cell apertures contained in said second cell aperture exposure areas, and said second cell aperture exposure areas are located closer to the central portion of said second mask than said first cell aperture exposure areas.

8. An electron beam lithography apparatus using a cell projection electron beam lithography method, comprising:

an electron gun arranged to emit an electron beam;

a first mask having a first rectangular aperture for forming said electron beam emitted from said electron gun into a rectangular cross-sectional electron beam;

a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and a cell projection system having a demagnification lens and an objective lens, arranged to receive said electron beams from said second mask and to write said cell figures on a target surface to be pattern-formed;

wherein said first cell aperture exposure areas are located on a peripheral portion of said second mask and said cell apertures contained in said first cell aperture exposure areas have a shorter aperture spacing than that of said cell apertures contained in said second cell aperture exposure areas, and said second cell aperture exposure areas are located closer to the central portion of said second mask than said first cell aperture exposure areas.

9. An electron beam lithography apparatus using a cell projection electron beam lithography method, comprising:

an electron gun arranged to emit an electron beam;

a first mask having a first rectangular aperture for forming said electron beam emitted from said electron gun into a rectangular cross-sectional electron beam;

a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and a cell projection system having a demagnification lens and an objective lens, arranged to receive said electron beams from said second mask and to write said cell figures on a target surface to be pattern-formed;

wherein said first cell aperture exposure areas are located on a peripheral portion of said second mask and said cell apertures contained in said first cell aperture exposure areas have a shorter aperture length than that of said cell apertures contained in said second cell aperture exposure areas, and said second cell aperture exposure areas are located closer to the central portion of said second mask than said first cell aperture exposure areas.

10. A pattern forming method using a cell projection electron beam lithography system, comprising the steps of:

irradiating an electron beam emitted from an electron gun onto a first mask having a first rectangular aperture, for forming said electron beam into a rectangular cross-sectional electron beam;

irradiating said rectangular cross-sectional electron beam from said first mask onto a second mask having a second rectangular aperture arranged on the central portion of said second mask, and first and second cell aperture exposure areas arranged around said second rectangular aperture, each of said first and second cell aperture exposure areas containing a plurality of cell apertures for forming said rectangular cross-sectional electron beam respectively into an electron beam having a cell figure determined by said respective cell apertures; and projecting said electron beams having said cell figures onto a target surface to be pattern-formed, through a cell projection system having a demagnification lens and an objective lens, for writing said cell figures on said target surface;

wherein said first cell aperture exposure areas are located on a peripheral portion of said second mask and said cell apertures contained in said first cell aperture exposure areas have a lower aperture area rate than that of said cell apertures contained in said second cell aperture exposure areas, and said second cell aperture exposure areas are located closer to the central portion of said second mask than said first cell aperture exposure areas in order to diminish aberrations of crossover images of said cell figures projected on said target surface.

11. A pattern forming method using a cell projection electron beam lithography system, comprising the steps of:

irradiating an electron beam emitted from an electron gun onto a first mask having a first rectangular aperture, for forming said electron beam into a rectangular cross-sectional electron beam;

irradiating said rectangular cross-sectional electron beam from said first mask onto a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and projecting said electron beams having said cell figures onto a target surface to be pattern-formed, through a cell projection system having a demagnification lens and an objective lens, for writing said cell figures on said target surface;

wherein said first cell aperture exposure areas are located on a peripheral portion of said second mask and said cell apertures contained in said first cell aperture exposure areas have a shorter aperture spacing than that of said cell apertures contained in said second cell aperture exposure areas, and said second cell aperture exposure areas are located closer to the central portion of said second mask than said first cell aperture exposure areas in order to diminish aberrations of crossover images of said cell figures projected on said target surface.

12. A pattern forming method using a cell projection electron beam lithography system, comprising the steps of:

irradiating an electron beam emitted from an electron gun onto a first mask having a first rectangular aperture, for forming said electron beam into a rectangular cross-sectional electron beam;

irradiating said rectangular cross-sectional electron beam from said first mask onto a second mask having a rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and projecting said electron beams having said cell figures onto a target surface to be pattern-formed, through a cell projection system having a demagnification lens and an objective lens, for writing said cell figures on said target surface;

wherein said first cell aperture exposure areas are located on a peripheral portion of said second mask and said cell apertures contained in said first cell aperture exposure areas have a shorter aperture length than that of said cell apertures contained in said second cell aperture exposure areas, and said second cell aperture exposure areas are located closer to the central portion of said second mask than said first cell aperture exposure areas in order to diminish aberrations of crossover images of said cell figures projected on said target surface.

13. An electron beam lithography apparatus using a cell projection electron beam lithography method, comprising:

an electron gun arranged to emit an electron beam;

a first mask having a first rectangular aperture for forming said electron beam emitted from said electron gun into a rectangular cross-sectional electron beam;

a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and a cell projection system having a demagnification lens and an objective lens, arranged to receive said electron beams from said second mask and to write said cell figures on a target surface to be pattern-formed;

wherein said first cell aperture exposure areas are located on a peripheral portion of said second mask and said cell apertures contained in said first cell aperture exposure areas have a lower aperture area rate than that of said cell apertures contained in said second cell aperture exposure areas, and said second cell aperture exposure areas are located closer to the central portion of said second mask than said first cell aperture exposure areas in order to diminish aberrations of crossover images of said cell figures projected on said target surface.

14. An electron beam lithography apparatus using a cell projection electron beam lithography method, comprising:

an electron gun arranged to emit an electron beam;

a first mask having a first rectangular aperture for forming said electron beam emitted from said electron gun into a rectangular cross-sectional electron beam;

a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and a cell projection system having a demagnification lens and an objective lens, arranged to receive said electron beams from said second mask and to write said cell figures on a target surface to be pattern-formed;

wherein said first cell aperture exposure areas are located on a peripheral portion of said second mask and said cell apertures contained in said first cell aperture exposure areas having a shorter aperture spacing than that of said cell apertures contained in said second cell aperture exposure areas, and said second cell aperture exposure areas are located closer to the central portion of said second mask than said first cell aperture exposure areas in order to diminish aberrations of crossover images of said cell figures projected on said target surface.

15. An electron beam lithography apparatus using a cell projection electron beam lithography method, comprising:

an electron gun arranged to emit an electron beam;

a first mask having a first rectangular aperture for forming said electron beam emitted from said electron gun into a rectangular cross-sectional electron beam;

a second mask having a second rectangular aperture arranged on the central portion of said second mask, and first and second cell aperture exposure areas arranged around said second rectangular aperture, each of said first and second cell aperture exposure areas containing a plurality of cell apertures, for forming said rectangular cross-sectional electron beam respectively into an electron beam having a cell figure determined by said respective cell apertures; and a cell projection system having a demagnification lens and an objective lens, arranged to receive said electron beams from said second mask and to write said cell figures on a target surface to be pattern-formed;

wherein said first cell aperture exposure areas are located on a peripheral portion of said second mask and said cell apertures contained in said first cell aperture exposure areas have a shorter aperture length than that of said cell apertures contained in said second cell aperture exposure areas, and said second cell aperture exposure areas are located closer to the central portion of said second mask than said first cell aperture exposure areas in order to diminish aberrations of crossover images of said cell figures projected on said target surface.

* * * * *